United States Patent
Beall et al.

(10) Patent No.: US 7,126,828 B2
(45) Date of Patent: Oct. 24, 2006

(54) SYSTEM AND METHOD FOR RETAINING CARDS IN AN INFORMATION HANDLING SYSTEM

(75) Inventors: Christopher S. Beall, Pflugerville, TX (US); Alex Z. Rodriguez, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 162 days.

(21) Appl. No.: 10/868,022

(22) Filed: Jun. 15, 2004

(65) Prior Publication Data
US 2005/0276025 A1    Dec. 15, 2005

(51) Int. Cl.
*H05K 7/12* (2006.01)

(52) U.S. Cl. .................. 361/801; 361/759; 361/747; 29/830

(58) Field of Classification Search ........... 361/801, 361/726, 732, 747, 759, 797, 798; 312/223.1, 312/223.2, 215, 216; 29/830
See application file for complete search history.

(56) References Cited

U.S. PATENT DOCUMENTS

| | | | |
|---|---|---|---|
| 5,601,349 A * | 2/1997 | Holt | 312/265.6 |
| RE36,695 E * | 5/2000 | Holt | 312/265.6 |
| 6,551,120 B1 | 4/2003 | Daskalakis et al. | |
| 6,608,765 B1 | 8/2003 | Vier et al. | |
| 6,618,263 B1 * | 9/2003 | Kin-Wing et al. | 361/759 |
| 6,618,264 B1 * | 9/2003 | Megason et al. | 361/759 |
| 6,639,807 B1 | 10/2003 | Carney et al. | |
| 6,674,650 B1 | 1/2004 | Davis et al. | |
| 6,700,791 B1 * | 3/2004 | Zappacosta | 361/759 |
| 6,950,313 B1 * | 9/2005 | Shih | 361/759 |

* cited by examiner

*Primary Examiner*—Kamand Cuneo
*Assistant Examiner*—Dameon E. Levi
(74) *Attorney, Agent, or Firm*—Haynes and Boone, LLP

(57) ABSTRACT

A card retention system comprises a chassis and a bracket provided to secure to the chassis by a first retention member. The first retention member is selectively oriented in one of a first position and a second position. The first position limits lateral movement of the bracket. The second position limits lateral and vertical movement of the bracket. A second retention member may also be provided on the chassis to resiliently engage the bracket to limit vertical movement of the bracket on the chassis.

9 Claims, 7 Drawing Sheets

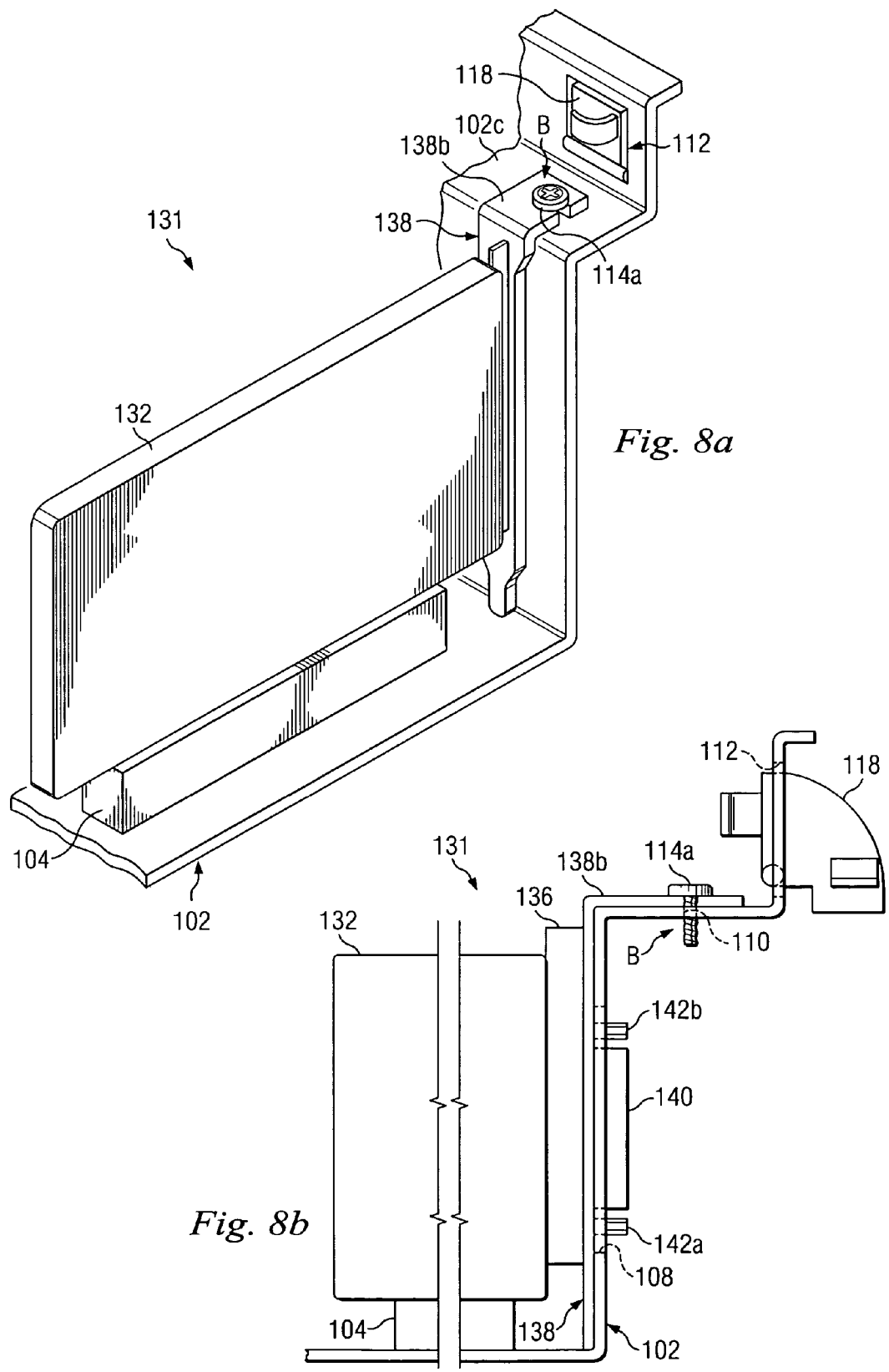

SYSTEM AND METHOD FOR RETAINING CARDS IN AN INFORMATION HANDLING SYSTEM

BACKGROUND

The present disclosure relates generally to information handling systems, and more particularly to a system and method for retaining cards in an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Cards used in information handling systems, such as PCI or expansion cards, are typically coupled to the system through slots on the motherboard. During handling of the system, forces on the cards can cause them to decouple from the system, resulting in system malfunction.

A variety of solutions have been provided to retain the cards in the system. It is desirable to provide toolless solutions, which make system maintenance and manufacture more efficient.

However, when the system experiences high stress, the forces exerted by the card on the toolless solutions may allow the card to uncouple from the system, resulting in system malfunction and customer dissatisfaction.

Accordingly, it would be desirable to provide a system and method for retaining cards in an information handling system absent the disadvantages found in the prior methods discussed above.

SUMMARY

According to one embodiment, a card retention system is provided that includes a chassis and a bracket provided to secure to the chassis by a first retention member. The first retention member is selectively oriented in one of a first position and a second position, wherein the first position limits lateral movement of the bracket on the chassis, and the second position limits both lateral and vertical movement of the bracket in the chassis.

A principal advantage of this embodiment is that a card may be secured in a chassis without the use of a tool. When the card requires more robust securing in the chassis, the card may be rigidly secured in the chassis utilizing the members used to secure the card in the chassis without the use of a tool.

BRIEF DESCRIPTION OF THE DRAWINGS

FIG. 8a is a perspective view illustrating an embodiment of the card of FIG. 5 being retained in the card retention system of FIG. 2.

FIG. 8b is a side view illustrating an embodiment of the card of FIG. 5 being retained in the card retention system of FIG. 2.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
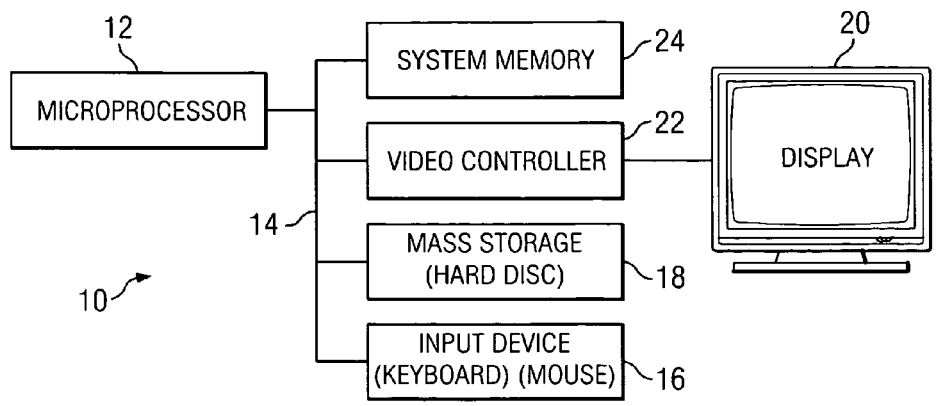
FIG. 1 is a schematic view illustrating an embodiment of an information handling system.

In one embodiment, information handling system 10, as illustrated in FIG. 1, includes a microprocessor 12 which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor 12 with fast storage to facilitate execution of computer programs by microprocessor 12. It should be understood that other busses and intermediate circuits can be deployed between the components described above and microprocessor 12 to facilitate interconnection between the components and the microprocessor 12.

Figure 2:
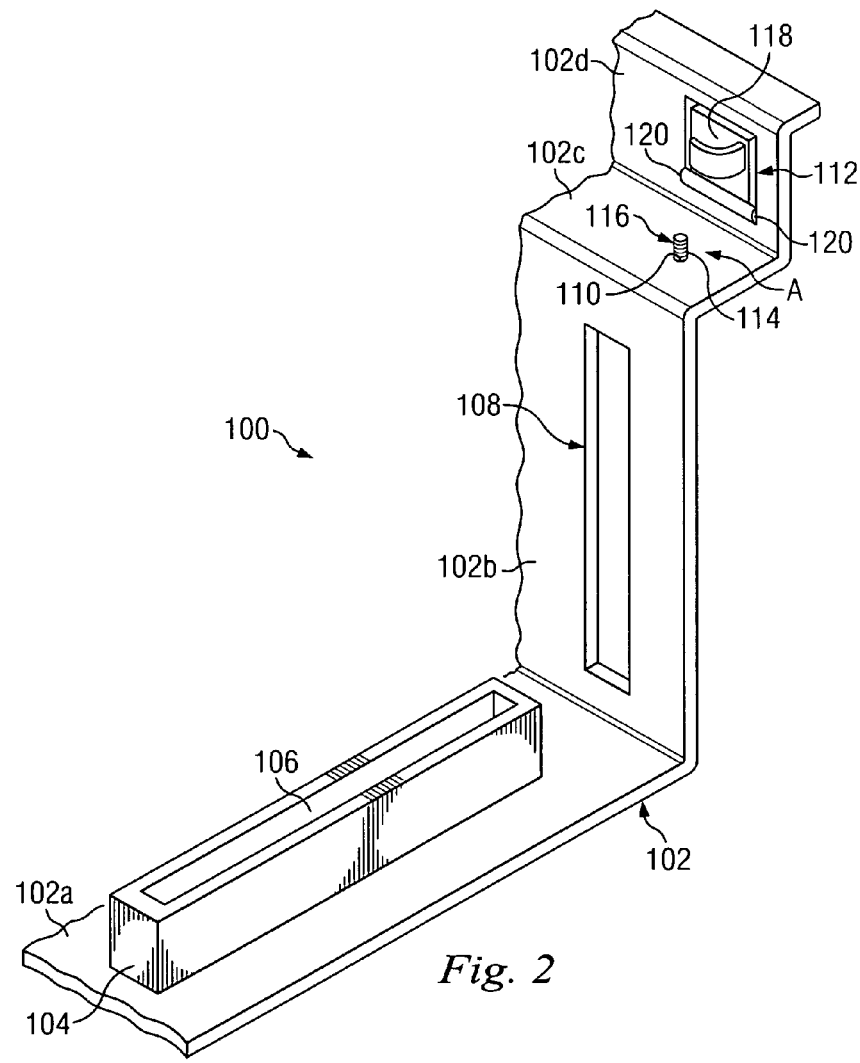
FIG. 2 is a perspective view illustrating an embodiment of a card retention system.
Figure 3:
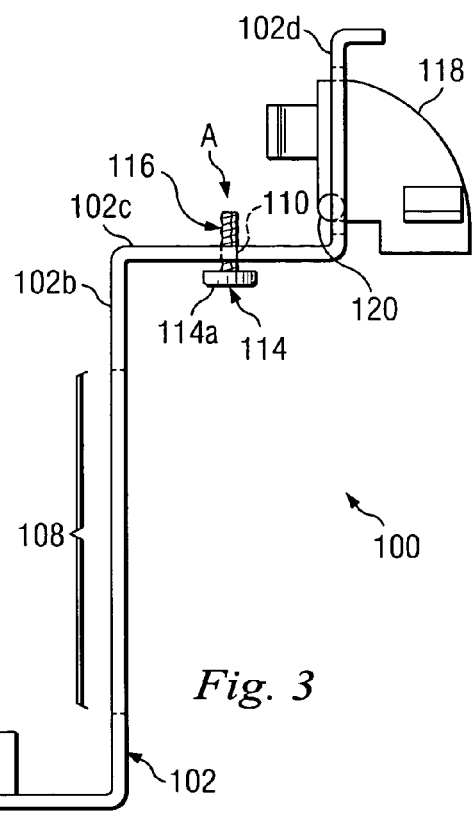
FIG. 3 is a side view illustrating an embodiment of the card retention system of FIG. 2.

Referring to FIGS. 2 and 3, a card retention system 100 includes a chassis 102. Chassis 102 includes a plurality of surfaces 102a, 102b, 102c and 102d, with surface 102a substantially parallel to surface 102c, surface 102b substantially parallel to surface 102d, and surfaces 102a and 102c substantially perpendicular to surfaces 102b and 102d. A coupler 104 is situated on surface 102a of chassis 102 and includes a connection 106 running along its length. Surface 102b provides an entrance to a hole 108 defined by chassis 102. Surface 102c provides an entrance to a hole 110 defined by chassis 102. Surface 102d provides an entrance to a hole 112 defined by chassis 102. A first retention member 114 is in a position A, partially situated in hole 110, and includes a first retention member end 116 extending from surface 102c and a head 114a situated on the underside of chassis 102 opposite surface 102c. A second retention member 118 is partially situated in hole 112 and pivotally connected to the chassis 102 at chassis pivotal connection 120. First retention member 114 may be a variety of removable securing devices and, in an exemplary embodiment, first retention member 114 may be a threaded fastener with threads corresponding to the size of hole 110 such that first retention member 114 may be threaded into hole 110 in order to secure first retention member 114 to chassis 102 in position A.

Figure 4A:
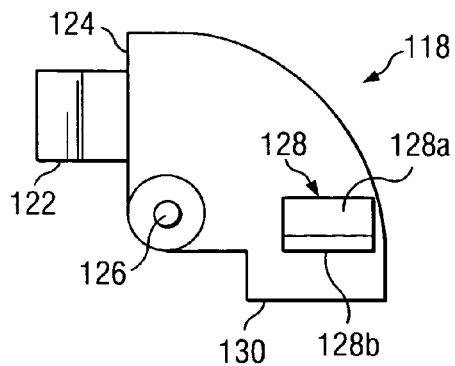
FIG. 4a is a side view illustrating an embodiment of a second retention member used in the card retention system of FIG. 2.
Figure 4B:
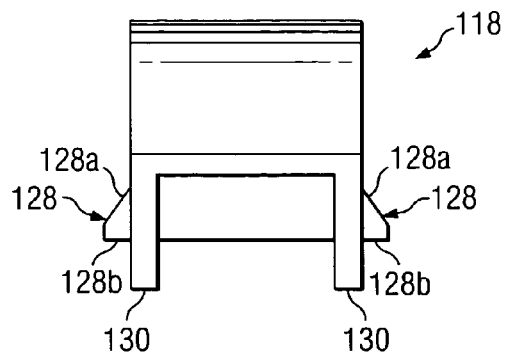
FIG. 4b is a rear view illustrating an embodiment of a second retention member used in the card retention system of FIG. 2.
Figure 4C:
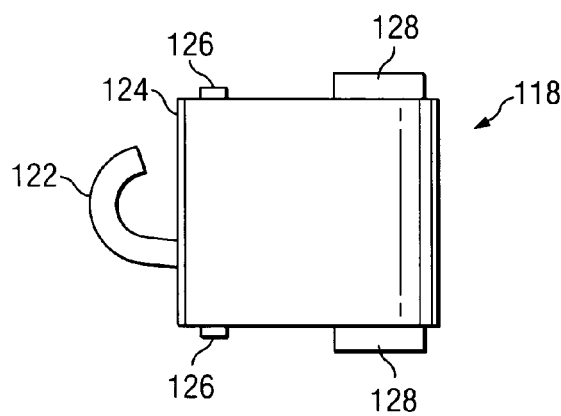
FIG. 4c is a top view illustrating an embodiment of a second retention member used in the card retention system of FIG. 2.

Referring now to FIGS. 4a, 4b, and 4c, second retention member 118 includes a arcuate member 122 extending from a surface 124 on second retention member 118. Arcuate member 122 is operable to provide a spring force and, in an exemplary embodiment, may include a coil spring, an elastic material, or a variety of equivalent devices known in the art. A plurality of pivot connections 126 exist on opposite sides of the second retention member 118. A plurality of locking members 128 include a beveled surface 128a and a locking surface 128b, and are situated on opposite sides of second retention member 118. A plurality of release members 130 extend from second retention member 118 and are situated on opposite sides of second retention member 118 adjacent the plurality of locking members 128.

Figures 5, 6:
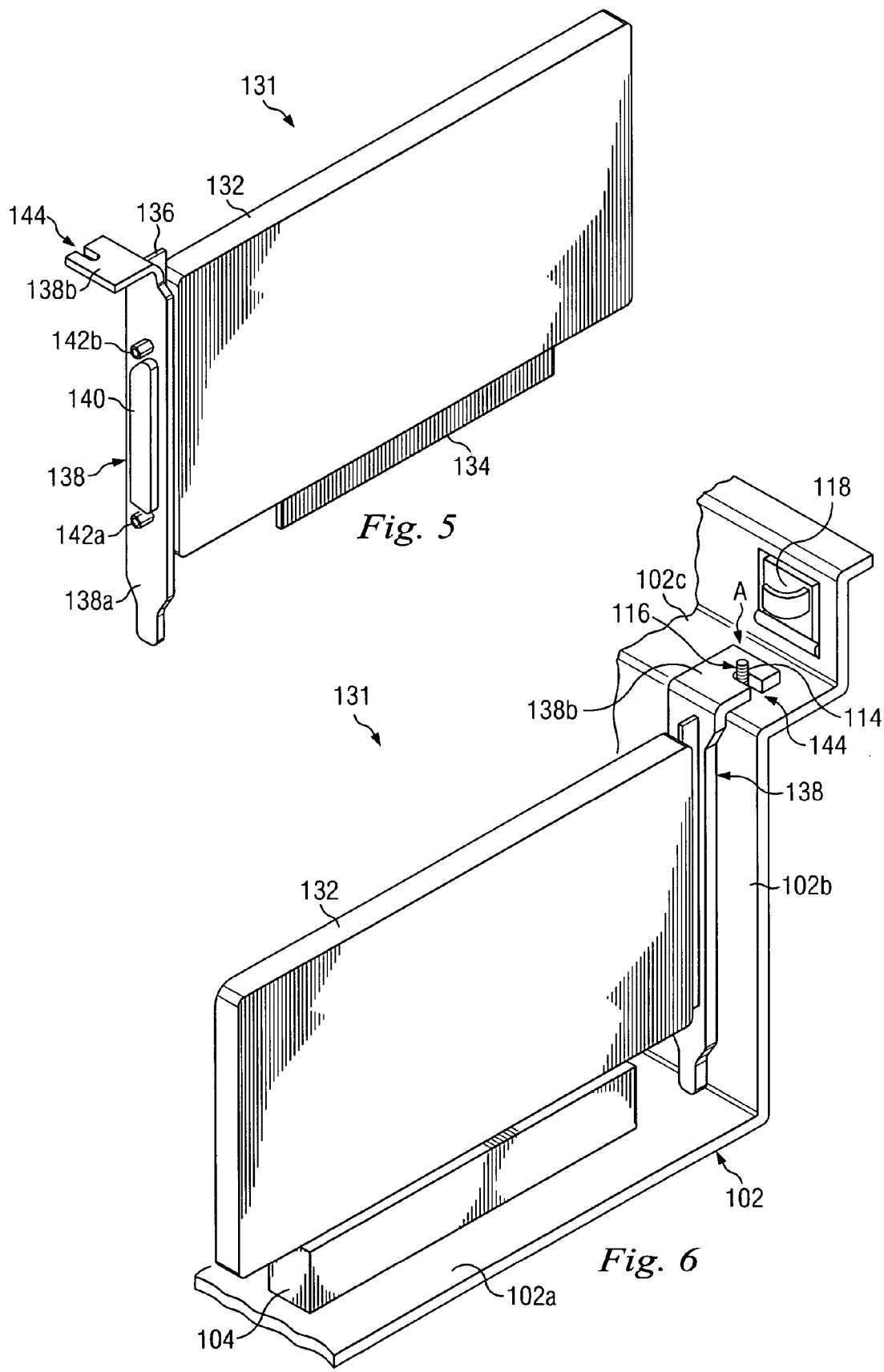
FIG. 5 is a perspective view illustrating an embodiment of a card used in card retention system of FIG. 2.
FIG. 6 is a perspective view illustrating an embodiment of the card of FIG. 5 coupled to the card retention system of FIG. 2.

Referring now to FIG. 5, a card 131 includes a base 132. An elongated card connection 134 extends from the bottom of base 132. A coupler 136 extends from a surface of the base 132 and couples a bracket 138 to the base 132. Bracket 138 includes a surface 138a and a tab 138b which is substantially perpendicular to surface 138a. A connector 140 is situated on, and extends from, surface 138a. A plurality of securing members 142a and 142b are situated on opposite sides of connector 140 and extend from surface 138a. Tab 138b defines a channel 144 running through tab 138b on bracket 138.

In operation, as illustrated in FIGS. 2, 5, and 6, card 131 is connected to the chassis 102 by placing elongated card connection 134 into connection 106 on coupler 104. With card 131 seated in coupler 104, surface 138a on bracket 138 engages surface 102b on chassis 102 with connector 140 and securing members 142a and 142b situated partially in and extending through hole 108, and tab 138b on bracket 138 engages surface 102c on chassis 102. First retention member 114 is in first position A with first retention member end 116 extending from surface 102c and situated in channel 144. With first retention member end 116 extending from surface 102c and situated in channel 144 on tab 138b, the lateral movement of bracket 138, and in turn the card 131, is limited.

Referring now to FIGS. 4a, 4b, 4c, 7a, and 7b, second retention member 118 may be pivoted about chassis pivotal connection 120 until arcuate member 122 engages tab 138b on bracket 138. As second retention member 118 is pivoted, a portion of the member 118 travels through hole 112 until the plurality of locking members 128 enter hole 112. Further pivoting of second retention member 118 causes arcuate member 122 to apply a force to tab 138 and beveled surface 128a to engage the sides of hole 112. Further pivoting of second retention member 118 will result in locking members 128 traveling all the way through hole 112 and locking surface 128b on locking members 128 engaging surface 102d on chassis 102. With locking surfaces 128b engaging surface 102d, second retention member 118 is held in place with arcuate member 122 applying a force to tab 138b, and vertical movement of tab 138b on bracket 138, and in turn the card 131, is limited.

Referring now to FIGS. 4a, 4b, 4c, 8a and 8b, when the card retention system 100 is expected to experience a high stress situation, the locking members 128 on second retention member 118 may be released from engagement with surface 102d on chassis 102 by pressing release members 130 towards each other, which causes locking surfaces 128b to disengage with surface 102d. Second retention member 118 may then be pivoted back through hole 112, disengaging arcuate member 122 from tab 138b. First retention member 114 is then reoriented in hole 110 to a position B such that head 114a engages tab 138b and secures tab 138b to surface 102c. In an exemplary embodiment, first retention member 114 may be a threaded fastener with threads corresponding to the size of hole 110 such that first retention member 114 may be threaded into hole 110 in order to secure first retention member 114 to chassis 102 in position B. With tab 138b secured to surface 102c by first retention member 114, the vertical and lateral movement of tab 138b on bracket 138, and in turn the card 131, is limited.

Figure 7A:
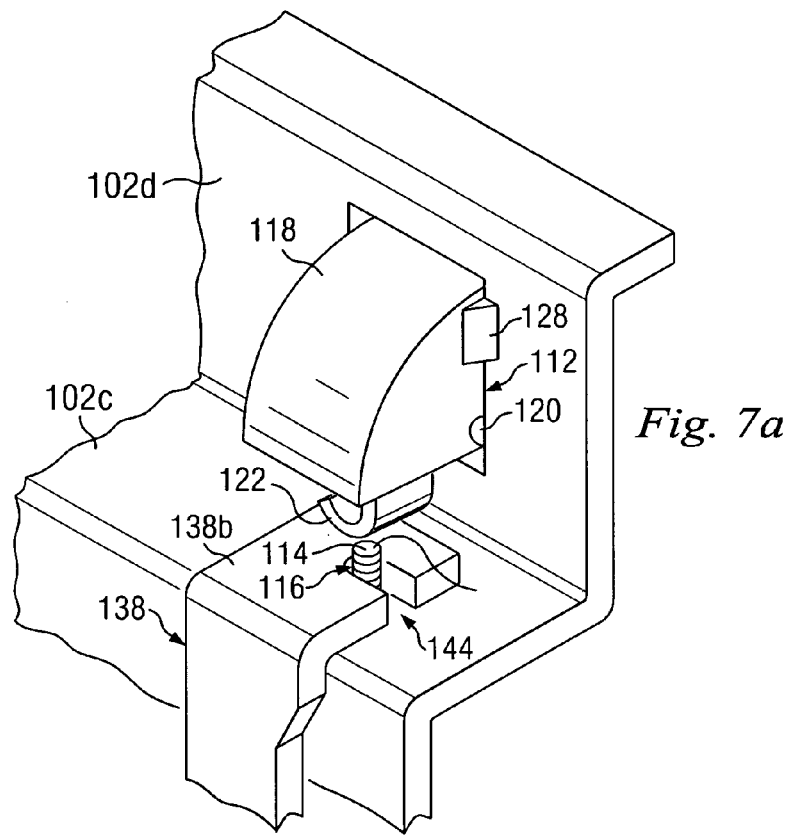
FIG. 7a is a perspective view illustrating an embodiment of the card of FIG. 5 being retained in the card retention system of FIG. 2.
Figure 7B:
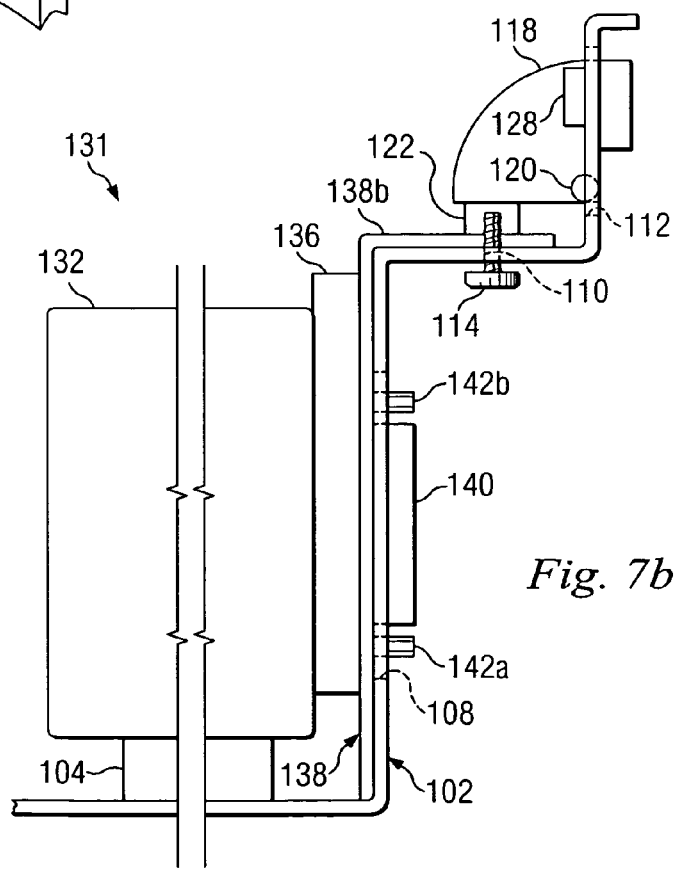
FIG. 7b is a side view illustrating an embodiment of the card of FIG. 5 being retained in the card retention system of FIG. 2.
Figure 9A:
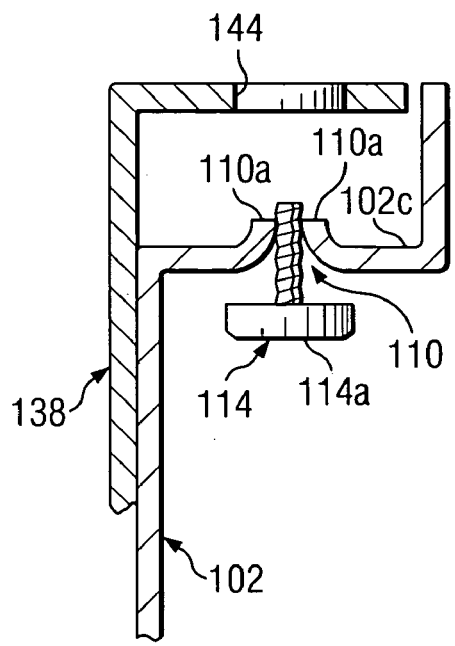
FIG. 9a is a side view illustrating an exemplary embodiment of a card retention system.
Figure 9B:
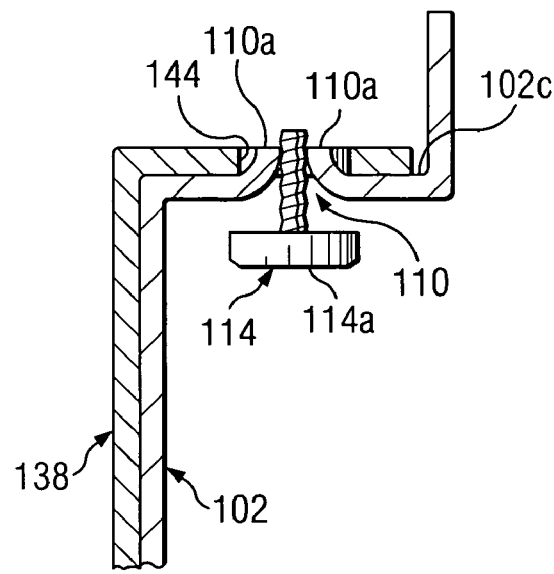
FIG. 9b is a side view illustrating an exemplary embodiment of a card retention system.
Figure 9C:
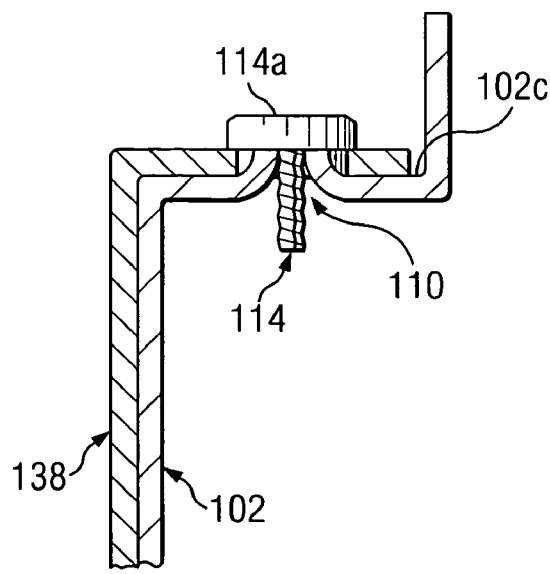
FIG. 9c is a side view illustrating an exemplary embodiment of a card retention system.

In an exemplary embodiment, as illustrated in FIGS. 9a, 9b, and 9c, chassis 102 may be constructed from sheet metal, and hole 110 may be formed in chassis 112 by punching a hole up through the surface 102c on chassis 102. This results in a lip 110a extending from surface 102c and around the edge of hole 110. Once bracket 138 is engaged with chassis 102, as illustrated in FIGS. 6 and 7a, lip 110a is situated in channel 144 and limits the lateral movement of bracket 138. When the card retention system 100 is expected to experience a high stress situation, the first retention member 114 may be reoriented, as illustrated in FIGS. 8 and 8a, to limit the vertical and lateral movement of the bracket 138.

Figure 10:
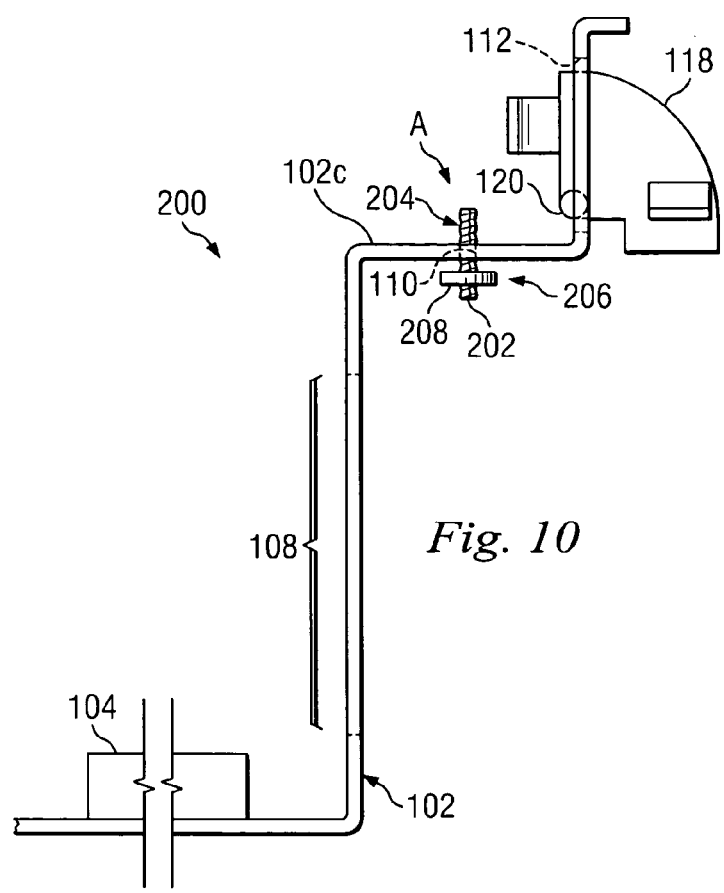
FIG. 10 is a side view illustrating an alternative embodiment of a card retention system.
Figure 11:
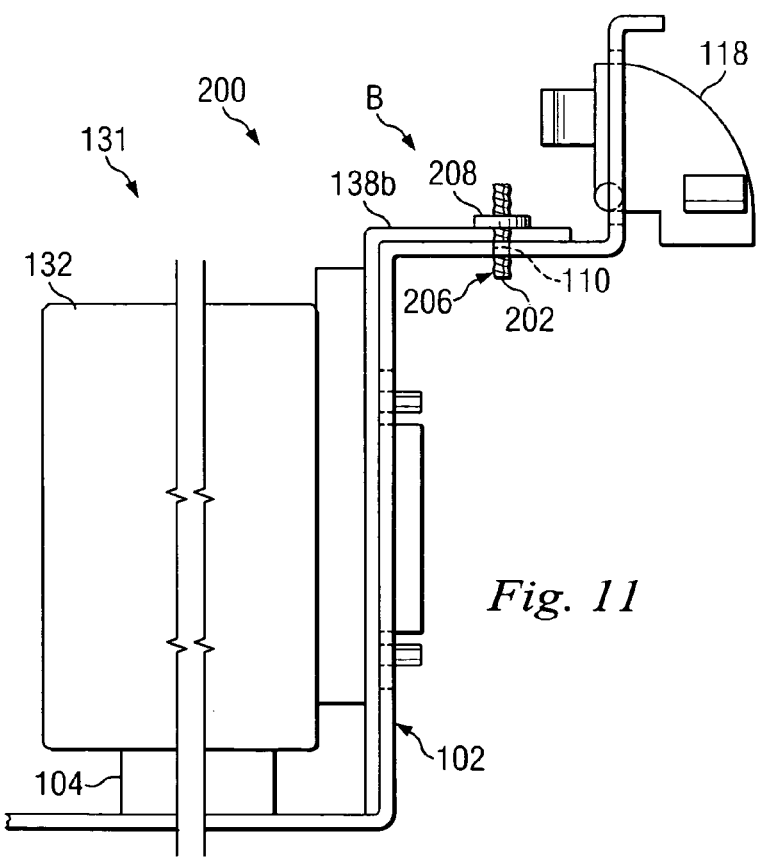
FIG. 11 is a side view illustrating an embodiment of the card of FIG. 5 being retained in the card retention system of FIG. 10.

Referring now to FIGS. 10 and 11, an alternative embodiment of a card retention system 200 is substantially identical in design and operation to card retention system 100 described above with reference to FIGS. 1–9c, with the addition of a modified first retention member 202 replacing the first retention member 114 of system 100. First retention member 202 is partially situated in hole 110 and includes a first retention end 204 extending from surface 102c on chassis 102 and a second retention end 206 extending from the underside of chassis 102 opposite the surface 102c. A nut 208 is situated in a position A on second retention end 206.

In operation, when the card retention system 200 is expected to experience a high stress situation, nut 208 is reoriented from position A on second retention end 206 to a position B on first retention end 204 to engage tab 138b and secure tab 138b to surface 102c on chassis 102. In an exemplary embodiment, first retention member 202 is an externally threaded member, and nut 208 includes internal threads corresponding to the external threads on first retention member 202. With nut 208 in position B, the vertical and lateral movement of tab 138b on bracket 138, and in turn the card 131, is limited.

It is understood that variation may be made in the foregoing without departing from the scope of the disclosed embodiments. Furthermore, the elements and teachings of the various illustrative embodiments may be combined in whole or in part some or all of the illustrative embodiments.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A card retention system comprising:
   a chassis;
   a bracket provided to secure to the chassis by a first retention member and selectively by a second retention member, the first and second retention members each being selectively oriented in one of a first position and a second position, the second retention member being pivotable into engagement with the bracket;
   whereby the first retention member in its first position limits only lateral movement of the bracket on the chassis;
   whereby the first retention member in its second position is inverse to its first position and limits both lateral and vertical movement of the bracket on the chassis;
   whereby the second retention member in its first position is out of contact with the bracket; and
   whereby the second retention member in its second position limits only vertical movement of the bracket in the chassis.

2. The system of claim 1 wherein the first retention member includes a threaded fastener.

3. The system of claim 1 wherein the first retention member includes a push rivet.

4. The system of claim 1
   wherein the second retention member resiliently engages the bracket to limit vertical movement of the bracket on the chassis.

5. The system of claim 1 further comprising:
   an expansion card coupled to the bracket.

6. An information handling system comprising:
   a chassis;
   a microprocessor coupled to the chassis;
   a bracket provided to secure to the chassis by a first retention member and selectively by a second retention member, the first and second retention members each being selectively oriented in one of a first position and a second position, the second retention member being pivotable into engagement with the bracket;
   whereby the first retention member in its first position limits only lateral movement of the bracket on the chassis;
   whereby the first retention member in its second position is inverse to its first position and limits both lateral and vertical movement of the bracket on the chassis;
   whereby the second retention member in its first position is out of contact with the bracket; and
   whereby the second retention member in its second position limits only vertical movement of the bracket in the chassis.

7. The system of claim 1 wherein the first retention member includes a threaded fastener.

8. The system of claim 1 wherein the first retention member includes a push rivet.

9. A method for retaining a card in an information handling system comprising:
   providing an information handling system including a chassis;
   situating a card and a bracket in the chassis;
   selectively orienting a first retention member in a first position in the chassis, the first position operable to limit only lateral movement of the card and bracket in the chassis;
   reorienting the first retention member to a second position in the chassis inverse to the first position, the second position operable to limit both lateral and vertical movement of the card and bracket in the chassis;
   pivoting a second retention member into engagement with the brackets only when the first retention member is in its first position; and
   pivoting the second retention member out of engagement with the bracket only when the first retention member is in its second position.

* * * * *